United States Patent
Burchill et al.

(10) Patent No.: US 10,050,164 B2
(45) Date of Patent: Aug. 14, 2018

(54) PHOTOVOLTAIC MODULES HAVING A POLYVINYLIDENE FLUORIDE BACKSHEET

(75) Inventors: Michael T. Burchill, Langhorne, PA (US); Jiaxin Jason Ge, Lower Providence, PA (US); Gregory S. O'Brien, Downingtown, PA (US); Saeid Zerafati, Villanova, PA (US)

(73) Assignee: Arkema Inc., King of Prussia, PA (US)

( * ) Notice: Subject to any disclaimer, the term of this patent is extended or adjusted under 35 U.S.C. 154(b) by 654 days.

(21) Appl. No.: 12/664,088

(22) PCT Filed: Jun. 11, 2008

(86) PCT No.: PCT/US2008/066498
§ 371 (c)(1),
(2), (4) Date: Dec. 11, 2009

(87) PCT Pub. No.: WO2008/157159
PCT Pub. Date: Dec. 24, 2008

(65) Prior Publication Data
US 2010/0175742 A1    Jul. 15, 2010

Related U.S. Application Data

(60) Provisional application No. 60/944,188, filed on Jun. 15, 2007.

(51) Int. Cl.
*H01L 31/18* (2006.01)
*H01L 31/048* (2014.01)
*H01L 31/049* (2014.01)

(52) U.S. Cl.
CPC ........ *H01L 31/049* (2014.12); *H01L 31/0481* (2013.01); *H01L 31/18* (2013.01); *Y02E 10/50* (2013.01)

(58) Field of Classification Search
CPC . H01L 31/0487; H01L 31/18; H01L 31/0481; H01L 31/049; Y02E 10/50
USPC .................. 136/244, 251, 252, 259
See application file for complete search history.

(56) References Cited

U.S. PATENT DOCUMENTS

| | | | |
|---|---|---|---|
| 5,985,444 A | 11/1999 | Olson et al. | |
| 6,369,316 B1 | 4/2002 | Plessing et al. | |
| 6,407,329 B1 * | 6/2002 | Iino et al. | 136/251 |
| 6,512,064 B2 | 1/2003 | Higuchi et al. | |
| 6,610,766 B1 * | 8/2003 | Kitamura et al. | 524/156 |
| 6,646,196 B2 | 11/2003 | Fronck et al. | |
| 6,660,930 B1 | 12/2003 | Gonsiorawski | |
| 6,777,610 B2 | 8/2004 | Yamada et al. | |
| 7,553,540 B2 | 6/2009 | Debergalis et al. | |
| 7,842,765 B2 | 11/2010 | Uschold et al. | |
| 7,981,478 B2 | 7/2011 | Snow et al. | |
| 8,012,542 B2 | 9/2011 | Snow et al. | |
| 8,025,928 B2 | 9/2011 | Snow | |
| 8,048,518 B2 | 11/2011 | Debergalis et al. | |
| 8,062,744 B2 | 11/2011 | Debergalis et al. | |
| 8,124,221 B2 | 2/2012 | Uschold et al. | |
| 8,168,297 B2 | 5/2012 | Snow | |
| 2002/0129848 A1 | 9/2002 | Miura et al. | |
| 2003/0157408 A1 * | 8/2003 | Sun | 429/249 |
| 2003/0204020 A1 * | 10/2003 | Wood et al. | 525/192 |
| 2004/0202866 A1 * | 10/2004 | Kernander et al. | 428/421 |
| 2007/0054129 A1 | 3/2007 | Kalkanoglu et al. | |
| 2007/0154704 A1 * | 7/2007 | Debergalis et al. | 428/323 |
| 2008/0053516 A1 | 3/2008 | Hayes | |
| 2009/0275251 A1 | 11/2009 | Bonnet et al. | |

FOREIGN PATENT DOCUMENTS

| | | |
|---|---|---|
| EP | 1 938 967 A1 | 2/2008 |
| JP | 10256580 | 9/1998 |
| JP | 2004214342 | 7/2004 |
| JP | 2004352966 | 12/2004 |
| KR | 20010092753 | 10/2001 |

OTHER PUBLICATIONS

Dupont. "Adhesion performance comparison table for DuPont BYNEL resins". http://www.dupont.com/content/dam/dupont/products-and-services/packaging-materials-and-solutions/packaging-materials-and-solutions-landing/documents/Bynel_adhesion_comparitor.pdf (2009).*

* cited by examiner

*Primary Examiner* — Lindsay Bernier
(74) *Attorney, Agent, or Firm* — Thomas F. Roland

(57) ABSTRACT

The invention relates to a photovoltaic module for capturing and using solar radiation having as a backsheet a composition containing polyvinylidene fluoride. The polyvinylidene fluoride backsheet layer is exposed to the environment and provides chemical resistance, low water vapor transmission, electrical insulation, and UV light protection.

5 Claims, No Drawings

PHOTOVOLTAIC MODULES HAVING A POLYVINYLIDENE FLUORIDE BACKSHEET

FIELD OF THE INVENTION

The invention relates to a photovoltaic module for capturing and using solar radiation having as a backsheet a composition containing polyvinylidene fluoride. The polyvinylidene fluoride backsheet layer is exposed to the environment and provides chemical resistance, low water vapor transmission, electrical insulation, and UV light protection.

BACKGROUND OF THE INVENTION

Photovoltaic modules consist of an outer glazing material, solar cells generally encapsulated in a clear packaging for protection, and a backsheet. The solar cells are made of materials known for use in solar collectors, including, but not limited to, silicon, cadmium indium selenide (CIS), cadmium indium gallium selenide (CIGS), quantum dots. The back sheet is exposed to the environment on the backside of the photovoltaic module. The primary function of the back sheet is to provide the low water vapor transmission, UV and oxygen barrier properties and necessary to protect the silicon wafers (photocells) from degradation induced by reaction with water, oxygen or UV radiation. Because the silicon wafers are generally encapsulated in ethylene vinyl acetate (EVA) the backsheet material should adhere well to EVA when the components are laminated together in a thermoforming process.

The backsheet of the collector can be a metal, such as steel or aluminum. However, more recently polymeric materials have been used in the back sheet. Tedlar, a polyvinyl fluoride material from DuPont (U.S. Pat. No. 6,646,196); an ionomer/nylon alloy (U.S. Pat. No. 6,660,930), and polyethylene terephthalate (PET) have all been used as the backsheet layer in photovoltaic modules, alone and in combination. PET is a polymer with excellent water vapor resistance and relatively lower cost, however it is susceptible to degradation from exposure to environmental influences, such as UV radiation, IR radiation, and ozone. In many backsheet constructions, PET is protected by the use of Tedlar (PVF) films, which are tough, photo-stable, chemically resistant and unaffected by long-term moisture exposure. They also adhere well to (EVA). However, Tedlar films are relatively expensive, and do have good resistance to water vapor. Thus the combination of Tedlar film and PET provides an excellent backsheet material. Typical constructions of photovoltaic back sheets are PVF/PET/PVF, PVF/Al/PVF and PVF/PET/Al/PVF multi-layered laminated films. However these constructions can suffer from the drawback of poor adhesion of the PVF to the PET. Adhesion is typically augmented by treatment of the polymeric surfaces with corona discharge or similar technology to increase adhesion in the PVF film. Similarly an adhesive on the PVF is employed to increase adhesion.

It has now been found that the use of polyvinylidene fluoride in backsheet compositions can provide performance, processing and cost improvements over current technology. Advantageously, adhesive layers and/or surface treatment can be eliminated for the PVDF to PET laminates. Backsheets formed from polyvinylidene fluoride (PVDF), polyvinylidene fluoride copolymers and polyvinylidene fluoride blends can take advantage of the properties of polyvinylidene fluoride to overcome the issues listed above with other materials.

SUMMARY OF THE INVENTION

The invention relates to a photovoltaic module or solar power generation unit, comprising:
 a) an outer transparent glazing material;
 b) encapsulated interconnected solar cells; and
 c) a back sheet comprising a polyvinylidene fluoride (PVDF) composition, wherein polyvinylidene fluoride comprises the outermost back layer.
 The PVDF layer can be present as a film that is coextruded, laminated or adhered,
or as a solvent or aqueous coating. The PVDF can be functionalized for increased adhesion, or can be used with a tie layer.

DETAILED DESCRIPTION OF THE INVENTION

By "photovoltaic modules", as used herein is meant a construction of photovoltaic cell circuits sealed in an environmentally protective laminate. Photovoltaic modules may be combined to form photovoltaic panels that are pre-wired, field-installable units. A photovoltaic array is the complete power-generating unit, consisting of any number of PV modules and panels.

The backsheet of the invention will contain one or more polyvinylidene fluoride (PVDF) or PVDF copolymer layers, with a polyvinylidene fluoride composition being the outermost sheet exposed to the environment.

Each PVDF layer composition of the invention may be a homopolymer, a copolymer, a terpolymer or a blend of a PVDF homopolymer or copolymer with one or more other polymers that are compatible with the PVDF (co)polymer. PVDF copolymers and terpolymers of the invention are those in which vinylidene fluoride units comprise greater than 70 percent of the total weight of all the monomer units in the polymer, and more preferably, comprise greater than 75 percent of the total weight of the units. Copolymers, terpolymers and higher polymers of vinylidene fluoride may be made by reacting vinylidene fluoride with one or more monomers from the group consisting of vinyl fluoride, trifluoroethene, tetrafluoroethene, one or more of partly or fully fluorinated alpha-olefins such as 3,3,3-trifluoro-1-propene, 1,2,3,3,3-pentafluoropropene, 3,3,3,4,4-pentafluoro-1-butene, and hexafluoropropene, the partly fluorinated olefin hexafluoroisobutylene, perfluorinated vinyl ethers, such as perfluoromethyl vinyl ether, perfluoroethyl vinyl ether, perfluoro-n-propyl vinyl ether, and perfluoro-2-propoxypropyl vinyl ether, fluorinated dioxoles, such as perfluoro(1,3-dioxole) and perfluoro(2,2-dimethyl-1,3-dioxole), allylic, partly fluorinated allylic, or fluorinated allylic monomers, such as 2-hydroxyethyl allyl ether or 3-allyloxypropanediol, and ethene or propene. Preferred copolymers or terpolymers are formed with vinyl fluoride, trifluoroethene, tetrafluoroethene (TFE), and hexafluoropropene (HFP).

Especially preferred copolymers are of VDF comprising from about 71 to about 99 weight percent VDF, and correspondingly from about 1 to 29 percent HFP percent VDF, and correspondingly from about 1 to about 29 percent TFE; from (such as disclosed in U.S. Pat. No. 3,178,399); and from about 71 to 99 weight percent VDF, and correspondingly from about 1 to 29 weight percent trifluoroethylene.

Especially preferred thermoplastic terpolymers are the terpolymer of VDF, HFP and TFE, and the terpolymer of VDF, trifluoroethene, and TFE. The especially preferred terpolymers have at least 71 weight percent VDF, and the other comonomers may be present in varying portions, but together they comprise up to 29 weight percent of the terpolymer.

The PVDF layer could also be a blend of a PVDF polymer with a compatible polymer, such as polymethyl methacrylate (PMMA), where the PVDF makes up greater that 50 weight volume percent. PVDF and PMMA can be melt blended to form a homogeneous blend. A preferred embodiment is a blend of 60-80 weight percent of PVDF and 20-40 weight percent of polymethyl methacrylate of a polymethylmethacrylate copolymer.

The PVDF layer could also consist of an acrylic-modified fluoropolymer (AMF), as described in U.S. Pat. No. 6,680,357, incorporated herein by reference.

The PVDF containing backsheet generally has a total thickness of from 25 microns to 500 microns, preferably from 75 to 350 microns in thickness, and can be a single layer, or a multi-layer construction. In one embodiment, the backsheet consists of a 10 mil barrier layer with a 1 mil PVDF layer on each side.

The PVDF layer, in addition to PVDF may contain other additives, such as, but not limited to impact modifiers, UV stabilizers, plasticizers, fillers, coloring agents, pigments, antioxidants, antistatic agents, surfactants, toner, pigments, and dispersing aids. In a preferred embodiment, a pigment is added to aid in reflectance of light back into the solar module. Since UV resistance is a prime function of the back layer, UV adsorbers are preferably present at levels of from 0.05 percent to 5.0 percent in the PVDF and/or barrier layers. Also pigments can be employed at levels from 2.0 percent to 30 percent by weight, based on the polymer. In one embodiment, a weatherable fluorpolymer layer is made up of 30 to 100 weight percent fluoropolymer; 0 to 70 weight percent of a compatible resin, for example a (meth)acrylic polymer or copolymer; 0-30 weight percent of a mineral filler or pigment; and 0 to 7 weight percent of other additives In a preferred embodiment, the fluoropolymer is functionalized. One or more functional fluoropolymer layers may be combined with at least one layer having even better moisture vapor barrier properties. The functional fluoropolymer could be a functionalized polyvinylidene fluoride polymer, such as for example a maleic anhydride functional PVDF (including KYNAR ADX from Arkema). The functional fluoropolymer could also be a functional ETFE or EFEP, as known in the art. Useful barrier layers include aluminum, PET, PEN, and EVOH. In one embodiment, the aluminum is in the form of aluminum foil.

The fluoropolymer contains functional groups or is blended with a functional (preferably compatible) co-functional co-resin (such as a functional acrylic type resin). The melting point of this fluoropolymer is preferably compatible for co-extrusion with a functional tie-layer resin (such as LOTADER AX8900 or AX8840 or ADX1200) that can chemically bond with the functionality in the fluoropolymer layer. This layer may be formulated with other functional and non-functional resins to optimize overall performance such as moisture resistance, dielectric strength, thermal resistance, and other properties.

The functional fluoropolymer could also be coextruded with a functional tie-layer resins and an optional third layer that could include polyethylene terephthalate; copolymers of other polyethylene terephthalate that are modified with other glycols such as neopentyl glycol to reduce the melting point; other polyesters based upon terephthalic acid; natural resource based polyesters such as polylactic acid; a LOTADER XLP that is a nanophase separated product with of polyamide and polyolefins.

The PVDF and moisture barrier may be combined by means such as co-extrusion or lamination. Useful moisture vapor barrier include, but are not limited to, ethylene vinyl alcohol, polyethylene terephthalate, polypropylene terephthalate, and reactive polyethylenes such as LOTADER reactive polyethylenes from Arkema Inc. The reactive polyethylenes include, but are not limited to, ethylene-methyl acrylate-maleic anhydride, ethylene-butyl acrylate-maleic anhydride, ethylene-ethyl acrylate-maleic anhydride, ethylene/glycidyl methacrylate, and ethylene-maleic anhydride-glycidyl methacrylate. The barrier layer could also be a metal, such as aluminum foil. Various tie layers have been identified.

The barrier layer may have a polyvinylidene layer on one or both sides. When the PVDF layer is on both sides of a barrier layer, each side is preferably the same composition, to aid in manufacturing, though the layers could also have different thicknesses and compositions. For some constructions, the barrier layer and PVDF can be adhered using an adhesive or tie layer. Useful tie layers include KYNAR ADX, KYNARFLEX, KYNAR/acrylic mixtures, LOTADER, available from Arkema Inc. Another useful tie layer consists of acrylic block copolymers. These block copolymers could be formed by a controlled radical polymerization process, and include copolymers such as b-PMMA/b-polybutylacrylate/b-PMMA, or b-PMAA/b-polybutylacrylate/b-PMAA The Kynar film can be treated by techniques such as corona discharge to improve the adhesive properties.

In a preferred embodiment, the PVDF layer directly adheres to the barrier layer without the need of a tie layer or adhesive. Useful PVDF for direct adhesion include PVDF copolymers with HFP levels of from 5-30 weight percent, and maleic anhydride grafted PVDF. The adhesion takes place either by a coextrusion of the multi-layer back sheet prior to assembly into the photovoltaic module, or else forming a laminate of separate layer during the heat/cure process for forming the module as a whole.

In one embodiment, the PVDF layer is selected for its ability to adhere to the ethylene vinyl acetate encapsulant.

The backsheet is preferably formed in a coextrusion or blown film process, then applied to the back of the photovoltaic module—but extrusion lamination is also possible.

A backsheet may be formed by extrusion lamination of a functional polyvinylidene fluoride-based formulation or a polyvinylidene fluoride-based formulation containing a compatible functional co-resin onto a PET or other substrate. The substrate may be pretreated (coated with adhesive for example) so that the surface contains functional groups that can chemically react or bond with those in the VF2 based formulation and the PET. The bonding may occur during the extrusion lamination or during a thermal post-treatment of the structure.

Extrusion coating of a UV opaque PVDF composition onto treated PET or polyethylene napthalate (PEN) can be used to produce a useful backsheet.

A blend of PVDF with up to 50 percent acrylic, 0-30 percent mineral pigment filler, and 0-5 UV absorber, by weight can be extrusion laminated onto PET to form a backsheet.

Examples of useful backsheets of the invention and means for forming them are listed below. One of ordinary skill in the art couls imagine many other examples of PVDF containing backsheets, based on the specification and the examples below.

Functional PVDF layer//LOTADER ADX 1200//PET or PETG//
  PVDF/acrylic blend//LOTADER//PVDF/acrylic blend
  PVDF/LOTADER/PVDF
  PVDF homopolymer single layer
  PVDF/HFP copolymer single layer
  PVDF copolymer/aluminum foil/PVDF copolymer In one embodiment a coextruded five-layer sheet is formed as: PVDF or PVDF/Acrylic compound//tie layer//PETG//tie layer//PVDF or PVDF acrylic compound. If additional strength is needed—the material may be bi-axially oriented.

In another embodiment a co-extruded three-layer sheet having an outer layer formulated with PVDF-grafted with-maleic anhydride (KYNAR ADX from Arkema) with a functionalized polyethylene (LOTADER PE-co-GMA) tie layer (LOTADER AX8840, AX8900 and ADX1200 from Arkema) and ethylene vinyl acetate (EVA) or polyamide 6-g-LOTADER PE-co-MA (LOTADER XLP). The back sheet might also include another tie layer of LOTADER (GMA) and a KYNAR ADX compound layer. An alternative to a KYNAR ADX compound could be KYNAR+PMMA acid (HT 121 or high acid PMMA) compound). This could be an alternative backsheet without the need for a PET layer while still maintaining good moisture barrier resistance. Other resins could also take the place of the LOTADER XLP noted above. Preferred options would have low moisture absorption and high dielectric strength.

A variant of this embodiment would have an outer KYNAR ADX layer with a LOTADER GMA and LOTADER XLP with EVA formulated for encapsulant.

Another approach to forming a polyvinylidene fluoride outer layer is by coating with a solvent or aqueous-based coating. A fluoropolymer layer as a solvent coating based on PVDF or PVDF copolymers may be applied by known means onto a PET layer. Surprisingly, adhesion of the coating is very good. Optionally the surface of the PET could be treated to enhance adhesion via addition of a primer with or without a high energy surface pre-treatment (corona or plasma). The formulation could include 0 to 30% by weight of mineral filler such as TiO2, acrylic polymers, stabilizers, and other additives. The melting point of the PVDF can be from room temperature to 150° C. For low temperature melting point polymers—the thermal resistance of these coatings to future PV module lamination conditions (150 C for 5 minutes) can be improved by optionally formulating a cross-linked formulation.

An aqueous-based polyvinylidene fluoride can be applied via a latex coating based upon our acrylic modified fluoropolymer and coated onto a PET or other substrate. Adhesion of the acrylic-modified polymer is surprisingly very good. Optionally the surface of the PET could be treated to enhance adhesion via addition of a primer with or without a high energy surface pre-treatment (corona or plasma). The formulation would include additives—as in the solvent coating.

Coating could also contain functional comonomers (such as HEMA) having a hydroxyl equivalent of between 10 and 100 and most preferably 20 and 80. The coating resin content contains 50 to 100% of VF2 based polymer, 10 to 50% of functional acrylic monomer. The coating can further contain 0 to 30% mineral filler, 0 to 7% stabilizers and process aides and also contains 2 to 33% of a low molecular weight cross-linker that both cross-links the fluoropolymer formulation, and bonds to the surface of the PET or other layer polymer to produce a simple low cost backsheet for PV modules. Examples of useful cross-linkers include DESMODUR N3300, DESMODUR 4265 BL and CYMEL 300 and 303. The addition of the cross-linking improves thermal stability resistance of the coating, hardness and scratch resistance and even solvent resistance.

Multi-layer structures containing a variety of barrier layers (moisture) and dielectric strength layers (for dielectric breakdown strength) may be produced by a variety of methods. Tie-layers and other layers could be extrusion or heat laminated, co-extruded, solvent coated, etc onto the fluoropolymer film layer, especially when the fluoropolymer layer is functionalized. It could be a very interesting application for ADX. Barrier layers could in this case include. The PVDF layer may be coated with adhesives to effectively bond to the barrier layer. A backsheet with an outer weatherable layer of functional PVDF (ADX) containing solvent coating put onto one or both sides of aluminum foil, which can then be bonded chemically to other dielectric materials to form an effective and low permeation backsheet for PV modules.

EXAMPLES

Example 1: (Solution Coating Example)

A solution coating formulation was prepared using the formulation shown in Table 1. This formulation was mixed by shaking for 30 minutes the contents with 125 grams of 4 mm glass beads on a paint shaker. This coating is not crosslinked. This coating was coated onto a 5 mil PET available from SKC Films known at SH-22 (this is chemically treated to improve adhesion) using a 5 mil blade. It was allowed to flash in air for 5 minutes and then oven cured for 3 minutes at 350° F. in a forced air oven. The dry coating thickness is approximately 1 mil. The coated film was immersed into water at 85° C. for 72 hours, dried and cross-hatch adhesion was tested using the general procedure defined in ASTM D3359. The adhesion I reported as a percent retained after the tape has been applied and removed. A value of 100% means that all of the squares are still adhered to the substrate. A value of 50% means that 50% of the squares are retained on the substrate.

In this example the sample adhesion was noted at 100%—which shows excellent adhesion.

TABLE 1

| Solvent Coating Example #1 | Amount (g) |
| --- | --- |
| KYNAR ADX PVDF Resin | 15.9 |
| PARALOID B44 Acrylic | 6.8 |
| t-butyl Acetate | 55.3 |
| NMP | 9.7 |
| R-960 - TiO2 | 12.3 |
| Total | 100.0 |

Example 2: (Dispersion Coating Example)

A dispersion coating example formulated with KYNAR 500 powder, a functional acrylic and a cross-linker to both cross-link the acrylic but also to potentially bond with the treated PET. The formulation of Table 2 was mixed for 30 minutes with 125 g of 4 mm glass beads in a paint shaker similar to that in Example 1. The coating was coated onto 5 mil PET film available from SKC (SH 22). It was allowed to flash at room temperature for 5 minutes followed by oven curing for 3 minutes at 350° F. The film laminate was submerged in 85° C. water for 72 hours, and cross-hatch adhesion was tested as in Example 1 with 80 to 90% of the squares being retained on the substrate. This shows excellent adhesion that can be enhanced by optimizing the baking temperature.

TABLE 2

| Solvent Dispersion Example #2 | Amount (g) |
|---|---|
| Kynar 500 Powder | 20.5 |
| PARALOID AU 1033 Acrylic (50%) | 17.6 |
| Isoporone | 41.8 |
| CYMEL 300 | 2.2 |
| NACURE 2500 | 0.6 |
| R-960 - TiO2 | 15.8 |
| Total | 89.7 |

Example 3 (Comparative)

As a comparative example—a formulation similar to that of Example 2 was made: (see Table 3)

TABLE 3

| Solvent Dispersion Comparative Example #1 | Amount (g) |
|---|---|
| KYNAR 500 Powder | 20.5 |
| PARALOID B44 | 8.8 |
| Isoporone | 41.8 |
| R-960 - TiO2 | 15.8 |

This formulation was mixed in a similar fashion to that in example 2. The same procedure was used to produce and bake the film. The sample was immersed in water at 85° C. for 72 hrs and the cross-hatch adhesion was tested. The results showed that the film adhesion showed 0% of the cross-hatch squares were retained.

Example 4

An aqueous coating was formulated based upon Arkema acrylic modified fluoropolymer technology. In the formulation noted below—the pigment concentrate was produced using a Cowles high speed mixer where it was run at 2000 rpm for 15 minutes and then 4000 rpm for 30 minutes. The latex formulation was mixed using a low speed mixing stirrer art 500 rpm for 10 minutes and the thickener was added in two aliquots as noted. These are then blended together on the low speed stirrer for another 10 minutes, filtered and coated onto the same a pre-treated PET as in example 1 using a 5 mil draw down blade to a dry coating thickness of approximately 1 mil. The sample was allowed to flash at room temperature for 10 minutes and then oven baked for 10 minutes at 55° C. The samples were immersed in water at 85° C. for 72 hours and tested for coating adhesion as in example 1. There was excellent adhesion as noted by a 100% retention of squares on the substrate.

| Aqueous Latex Example 4 | Amount (g/l) |
|---|---|
| Pigment Concentrate | |
| Water | 51.1 |
| DISPERBYK 180 | 4.7 |
| Ammonia | 0.1 |
| TEGOFOAMEX 810 | 0.5 |
| TRITON CF-10 | 1.9 |
| R-960 - TiO2 | 189.0 |
| Total | 247.3 |
| Latex Formulation | |
| KYNAR AQUATEC RC-10,206 (70:30 PVDF:Acrylic FMA at 50% solids) | 644.9 |
| Ammonia | 12.1 |
| ACRYSOL RM-8W thickener (associative thickener) | 3.6 |
| Dipropylene glycol methyl ether | 46.8 |
| Water | 72.8 |
| RHOPLEX 2438 (acrylic latex 25% solids) | 161.2 |
| STRODEX PK-0 VOC (antifoam) | 16.1 |
| ACRYSOL RM-8W thickener | 22.2 |
| Total | 979.7 |

What is claimed is:

1. A method for forming a photovoltaic module, comprising:
   a) providing an outer transparent glazing material;
   b) providing encapsulated interconnected solar cells; and
   c) providing a multi-layer back sheet,
   said multi-layer back sheet comprising in order from the outermost layer to the inner most layer:
   1) a back layer comprising at least one functionalized pigmented polyvinylidene fluoride (PVDF) film composition, consisting of functionalized polyvinylidene fluoride, from 2.0 to 30 percent by weight of pigment based on the weight of the PVDF, and from 0 to 7 weight percent of other additives; wherein said functionalized polyvinylidene fluoride is selected from a) a maleic anhydride grafted polyvinylidene fluoride copolymer having 1 to 29 weight percent of hexafluoropropene, and b) a blend of a non-functional PVDF polymer with a functional acrylic polymer wherein at least 50 percent by weight of the blend is PVDF;
   2) a functional tie layer resin, wherein said tie layer resin is selected from the group consisting of PVDF grafted with maleic anhydride and ethylene acrylate terpolymers; and
   3) at least one barrier layer;
   wherein said method comprises the steps of extrusion laminating or coextruding the back layer, the functional tie layer resin and the at least one barrier layer to form the multi-layer back sheet.

2. The method of claim 1, wherein said at least one barrier layer comprises ethylene vinyl acetate, polyethylene terephthalate, polypropylene terephthalate, aluminum or reactive polyethylenes.

3. The method of claim 1, wherein said back layer is directly in contact with said functional tie layer resin.

4. The method of claim 1, further comprising a dielectric strength layer.

5. The method of claim 1, wherein said back sheet is formed by extrusion lamination.

* * * * *